US010698049B2

United States Patent
Jonas et al.

(10) Patent No.: US 10,698,049 B2
(45) Date of Patent: Jun. 30, 2020

(54) SYSTEM AND METHOD FOR MAINTAINING VACUUM IN SUPERCONDUCTING MAGNET SYSTEM IN EVENT OF LOSS OF COOLING

(71) Applicant: KONINKLIJKE PHILIPS N.V., Eindhoven (NL)

(72) Inventors: Philip Alexander Jonas, Eindhoven (NL); Matthew Voss, Eindhoven (NL); Philippe Abel Menteur, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/558,369

(22) Filed: Sep. 3, 2019

(65) Prior Publication Data

US 2020/0003855 A1    Jan. 2, 2020

Related U.S. Application Data

(63) Continuation of application No. 15/533,137, filed as application No. PCT/IB2015/059233 on Dec. 1, 2015, now Pat. No. 10,401,448.

(Continued)

(51) Int. Cl.
*G01R 33/3815* (2006.01)
*G01R 33/38* (2006.01)
(Continued)

(52) U.S. Cl.
CPC ..... *G01R 33/3815* (2013.01); *G01R 33/3804* (2013.01); *H01F 6/04* (2013.01);
(Continued)

(58) Field of Classification Search
CPC ... G01R 33/3815; G01R 33/3804; H01F 6/06; H01F 6/04; F17C 2270/0536;
(Continued)

(56) References Cited

U.S. PATENT DOCUMENTS 4,765,397 A * 8/1988 Chrysler ............... H01L 23/473
165/104.33
4,986,077 A * 1/1991 Saho ..................... F02G 1/0445
250/352

(Continued)

FOREIGN PATENT DOCUMENTS

| GB | 2459104 A | * 10/2009 | ............... H01F 6/04 |
| GB | 2459104 A | 10/2009 | |
| WO | 0196020 A1 | 12/2001 | |

*Primary Examiner* — Devon Russell (57) ABSTRACT

An apparatus includes: a getter material disposed within a vacuum chamber to absorb stray molecules within the vacuum chamber; a thermal mass disposed adjacent the getter material and in thermal communication with the getter material; a cold station disposed within the vacuum chamber above the thermal mass; and a convective cooling loop connected between the thermal mass and the cold station and configured to convectively cool the thermal mass when the cold station is at a lower temperature than the thermal mass, and to thermally isolate the thermal mass from the cold station when the cold station is at a higher temperature than the thermal mass. The thermal mass may be water ice and may be thermally isolated from the walls of vacuum chamber by low loss support links and/or thermal reflective shielding.

20 Claims, 4 Drawing Sheets

Related U.S. Application Data (60) Provisional application No. 62/091,175, filed on Dec. 12, 2014.

(51) Int. Cl.
   *H01F 6/04* (2006.01)
   *H01F 6/06* (2006.01)

(52) U.S. Cl.
   CPC ........ *H01F 6/06* (2013.01); *F17C 2203/0395* (2013.01); *F17C 2270/0527* (2013.01)

(58) Field of Classification Search
   CPC ...... F17C 2203/0391; F17C 2203/0395; F25B 9/145; F25B 2500/07; F25B 2500/08; F25B 29/001
   See application file for complete search history.

(56) References Cited

U.S. PATENT DOCUMENTS

| | | | |
|---|---|---|---|
| 6,154,478 A * | 11/2000 | Vetrovec | H01S 3/036 372/34 |
| 7,323,963 B2 | 1/2008 | Nemoto et al. | |
| 2007/0171014 A1* | 7/2007 | Iwasa | G01R 33/3802 335/216 |
| 2007/0204630 A1 | 9/2007 | Tsuda | |
| 2008/0229928 A1* | 9/2008 | Urbahn | F04B 37/02 96/146 |
| 2008/0242974 A1* | 10/2008 | Urbahn | F25B 9/14 600/420 |
| 2009/0045895 A1 | 2/2009 | Kasten | |
| 2011/0039707 A1 | 2/2011 | Burgess et al. | |
| 2014/0123681 A1* | 5/2014 | Urbahn | F25B 21/00 62/3.1 |
| 2015/0323626 A1 | 11/2015 | Jonas et al. | |
| 2016/0189842 A1 | 6/2016 | Jonas et al. | |

* cited by examiner

SYSTEM AND METHOD FOR MAINTAINING VACUUM IN SUPERCONDUCTING MAGNET SYSTEM IN EVENT OF LOSS OF COOLING

This application is a continuation of U.S. Ser. No. 15/533,137 filed Jun. 5, 2017 which is the US National Stage Application of PCT/IB2015/059233 filed Dec. 1, 2015 which claims priority to U.S. Provisional Application 62/091,175 filed Dec. 12, 2014.

TECHNICAL FIELD

The present invention generally pertains to a system and method for maintaining a vacuum in a superconducting magnet system in the event of a loss of cooling of a cryogenic environment in which the superconducting magnet system is deployed.

BACKGROUND AND SUMMARY

Superconducting magnets are used in a variety of contexts, including nuclear magnetic resonance (NMR) analysis, and magnetic resonance imaging (MRI). To realize superconductivity, a magnet is maintained in a cryogenic environment at a temperature near absolute zero. Typically, the magnet includes one or more electrically conductive coils which are disposed in a cryostat and through which an electrical current circulates to create the magnetic field.

There are many ways to maintain the electrically conductive coil(s) of the superconducting magnet at cryogenic temperatures so that they remain superconducting during normal operation.

In some superconducting magnet systems (for example, so-called "cryofree systems") the magnet is maintained in a vacuum space and is cooled by a sealed system (e.g., a cold station or cold plate) which is filled with a relatively small amount of cryogenic fluid, for example one or two liters of liquid helium, so as to transfer heat from the electrically conductive coil(s) to a cold head which is in turn cooled via a compressor.

In such systems, it is beneficial to provide within the vacuum space a getter which is maintained at a very low temperature (e.g., below 20° K) so as to absorb stray molecules that may be released into the vacuum space, as such stray molecules can become a mechanism for heat transfer. In particular, over time the getter material accumulates gas molecules that may enter into the vacuum space from very small leaks.

However, it is possible that the cold head may become non-operational, for example due to a malfunction of the compressor, or due to a loss of AC Mains power for operating the compressor, thereby shutting down refrigeration of the superconducting magnet system. Such refrigeration shut down may occur during transportation, electrical outages, or equipment failure. In these cases, superconducting magnet systems with a small thermal heat capacity at low temperatures (e.g., cryofree systems having only a small amount of liquid helium inside a sealed system) may warm up rapidly above 20° K.

Meanwhile, if the getter is allowed to heat up, then the stray molecules which have been captured by the getter may be released into the vacuum chamber or cryostat which holds the superconducting magnet. If that occurs, an expensive and time-consuming vacuum pump down of the cryostat may be required to remove the released molecules.

Accordingly, it would be desired to provide a system and method for maintaining a vacuum in a superconducting magnet system in the event of a loss of cooling of a cryogenic environment in which the superconducting magnet system is deployed.

One aspect of the present invention can provide an apparatus including: a first getter material disposed within a vacuum chamber and which is configured to absorb stray molecules within the vacuum chamber; a thermal mass disposed adjacent the first getter material and in thermal communication with the first getter material; a cold station disposed within the vacuum chamber at a height greater than a height at which the thermal mass is disposed; and a convective cooling loop connected between the thermal mass and the cold station and configured to convectively cool the thermal mass when the cold station is at a lower temperature than the thermal mass, and to substantially thermally isolate the thermal mass from the cold station when the cold station is at a higher temperature than the thermal mass.

In some embodiments, the thermal mass can comprise a thermal mass of water ice.

In some embodiments, the cold station can be a 4° K cold station.

In some embodiments, the apparatus can further include: a thermal shield disposed within the vacuum chamber dividing the vacuum chamber into an inner region and an outer region; and a plurality of first low thermal conductivity support elements which connect the thermal shield to one or more outer walls of the vacuum chamber, wherein the thermal shield is isolated from the outer walls of the vacuum chamber except for the first low thermal conductivity support elements.

In some embodiments, the apparatus can further include: an independent structure disposed within an inner region of the vacuum chamber; and a plurality of second low thermal conductivity support elements which connect the independent structure to the thermal shield, wherein the independent structure is isolated from the thermal shield except for the second low thermal conductivity support elements.

In some embodiments, the apparatus can further include a plurality of third low thermal conductivity support elements which connect the thermal mass to the independent structure, wherein the thermal mass is isolated from the independent structure except for the third low thermal conductivity support elements.

In some embodiments, the apparatus can further include a thermally reflective structure disposed within the first region between the thermal mass and the thermal shield.

In some embodiments, the first getter material can comprise an activated charcoal material.

In some embodiments, the apparatus can further include a second getter material separated and apart from the first getter material and disposed adjacent to, and in thermal communication with, the cold station.

In some embodiments, the apparatus can further include a compressor disposed outside the vacuum chamber and connected to the cold station, and configured to conduct heat from the cold station to an exterior of the vacuum chamber.

Another aspect of the present invention can provide an apparatus, including: a vacuum chamber having one or more walls enclosing an interior space of the vacuum chamber; a heat shield disposed within the vacuum chamber, the heat shield defining an inner region of the vacuum chamber within the heat shield and an outer region of the vacuum chamber disposed between the heat shield and the one or more walls of the vacuum chamber; a superconducting magnet disposed within the inner region of the vacuum chamber; a cryocooler configured to cool the superconducting magnet, the cryocooler providing at least one cold station within the inner region of the vacuum chamber; a getter material disposed within the inner region of the vacuum chamber and which is configured to absorb stray molecules within the vacuum chamber; a thermal mass disposed adjacent the getter material and in thermal communication with the getter material, wherein the thermal mass is disposed at a lower greater than a height at which at least one cold station is disposed; and a convective cooling loop connected between the thermal mass and the cold station and configured to convectively cool the thermal mass when the cold station is at a lower temperature than the thermal mass, and to substantially thermally isolate the thermal mass from the cold station is at a higher temperature than the thermal mass.

In some embodiments, the apparatus can be a magnetic resonance imaging (MRI) apparatus further comprising: a patient table configured to hold a patient; gradient coils configured to at least partially surround a portion of a patient for which the MRI apparatus generates an image; a radio frequency coil configured to apply a radio frequency signal to the portion of a patient and to alter the alignment of this magnetic field; and a scanner configured to detect changes in the magnetic field caused by the radio frequency signal.

In some embodiments, the apparatus can further include: a compressor connected to remove heat from the cryocooler; and a magnet controller configured to control energization operations for the superconducting magnet.

In some embodiments, the thermal mass can comprise a thermal mass of water ice.

In some embodiments, the apparatus can further include a plurality of first low thermal conductivity support elements which connect the thermal shield to one or more outer walls of the vacuum chamber, wherein the thermal shield is isolated from the outer walls of the vacuum chamber except for the first low thermal conductivity support elements.

In some embodiments, the apparatus can further include: an independent structure disposed within an inner region of the vacuum chamber; and a plurality of second low thermal conductivity support elements which connect the independent structure to the thermal shield, wherein the independent structure is isolated from the thermal shield except for the second low thermal conductivity support elements.

In some embodiments, the apparatus can further include a plurality of third low thermal conductivity support elements which connect the thermal mass to the independent structure, wherein the thermal mass is isolated from the independent structure except for the third low thermal conductivity support elements.

Yet another aspect of the present invention can provide a method including: providing within a vacuum chamber a thermal mass adjacent to a getter material and in thermal communication with the getter material to absorb heat from the getter material; cooling the thermal mass with a cold station disposed within the vacuum chamber at a height greater than a height at which the thermal mass is disposed, in turn cooling the getter material, wherein the cooling is performed via a convective cooling loop connected between the thermal mass and the cold station; and absorbing stray molecules within the vacuum chamber with the cooled getter material, wherein the convective cooling loop substantially thermally isolates the thermal mass from the cold station when the cold station is at a higher temperature than the thermal mass.

In some embodiments, the method can further include cooling the getter material to a temperature below 20° K.

In some embodiments, the method can further include thermally isolating the thermal mass from outer walls of the vacuum chamber by a plurality of low thermal conductivity support elements.

BRIEF DESCRIPTION OF THE DRAWINGS

The present invention will be more readily understood from the detailed description of exemplary embodiments presented below considered in conjunction with the accompanying drawings.

DETAILED DESCRIPTION

The present invention will now be described more fully hereinafter with reference to the accompanying drawings, in which embodiments of the present invention are shown. The present invention may, however, be embodied in different forms and should not be construed as limited to the embodiments set forth herein. Rather, these embodiments are provided as teaching examples of the invention. Within the present disclosure and claims, when something is said to have approximately a certain value, then it means that it is within 10% of that value, and when something is said to have about a certain value, then it means that it is within 25% of that value.

Figure 1:
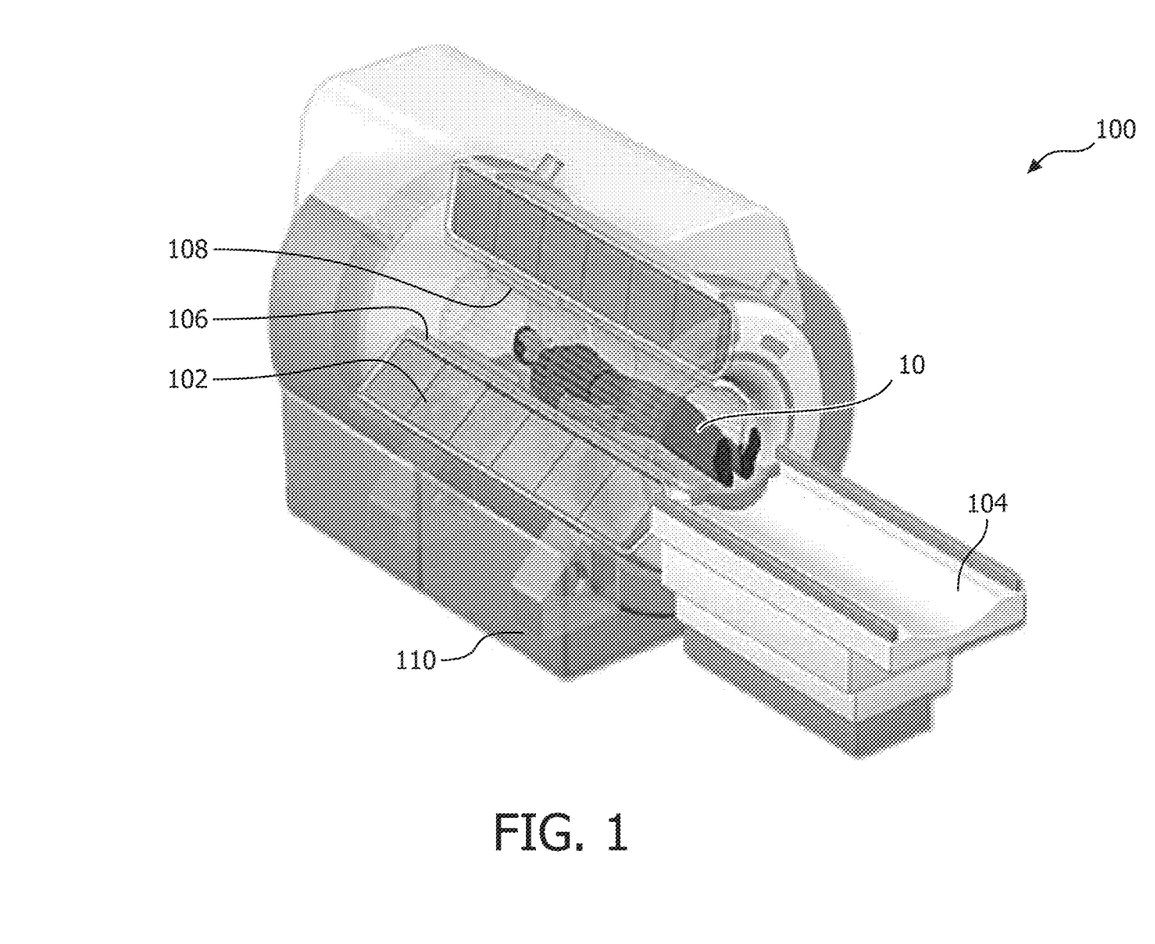
FIG. 1 illustrates an exemplary embodiment of a magnetic resonance imaging (MRI) apparatus.

FIG. 1 illustrates an exemplary embodiment of a magnetic resonance imaging (MRI) apparatus 100. MRI apparatus 100 may include a magnet 102; a patient table 104 configured to hold a patient 10; gradient coils 106 configured to at least partially surround at least a portion of patient 10 for which MRI apparatus 100 generates an image; a radio frequency coil 108 configured to apply a radio frequency signal to at least the portion of patient 10 which is being imaged, and to alter the alignment of the magnetic field; and a scanner 110 configured to detect changes in the magnetic field caused by the radio frequency signal.

The general operation of an MRI apparatus is well known and therefore will not be repeated here.

Figure 2:
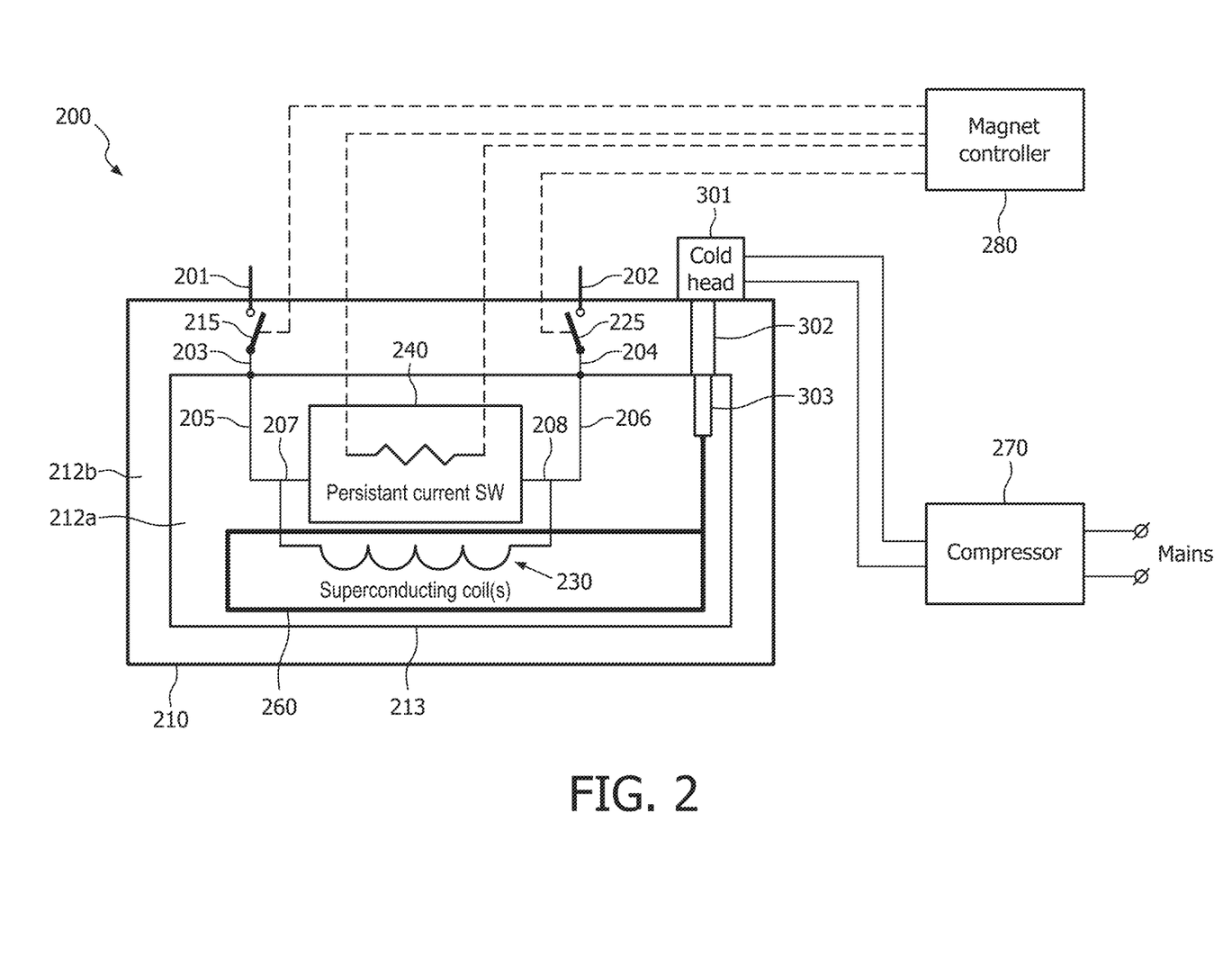
FIG. 2 illustrates an exemplary embodiment of a superconducting magnet system which may be included in an MRI apparatus.

FIG. 2 illustrates an exemplary embodiment of a superconducting magnet system 200 which may be included in an MRI apparatus. In particular, superconducting magnet system 200 may be one embodiment of magnet 102 in MRI apparatus 100. Furthermore, superconducting magnet system 200 may be one example of a superconducting magnet system for which a system and method as described below may be provided for maintaining a vacuum in the event of a loss of cooling of a cryogenic environment in which the superconducting magnet system is deployed. Examples of such a system and method will be described in greater detail below.

Superconducting magnet system 200 includes a cryostat 210 and a thermal shield 213 disposed within an enclosed space defined by the outer wall(s) or enclosure of cryostat 210. Thermal shield 213 defines a first, inner, thermal insulation region 212a (hereinafter "inner region 212a") and a second, outer, thermal insulation region 212b (hereinafter "outer region 212a"), each of which may be an evacuated space where any, gas, liquid, etc. has been removed, comprising a vacuum except for the areas occupied by the electrically conductive leads and other components, as described below. Accordingly, cryostat 210 may also be considered to be a vacuum chamber.

Superconducting magnet system 200 comprises a superconducting magnet formed as one or more electrically conductive coils 230 and a persistent current switch 240 disposed within inner region 212a of cryostat 210. Superconducting magnet system 200 also includes: a cryocooler including a cold head 301, with first and second cooling stages 302 and 303, driven by a compressor 270 to cool cryostat 210; and a magnet controller 280 configured to control energization operations for the superconducting magnet (i.e., electrically conductive coils 230).

Superconducting magnet system 200 further includes first and second electrically conductive leads 201 and 202, third and fourth electrically conductive leads 203 and 204, fifth and six electrically conductive leads 205 and 206, and seventh and eighth electrically conductive leads 207 and 208.

Superconducting magnet system 200 is a "cryofree" system or sealed system wherein cryostat 210 is not provided with means to add cryogenic material (e.g., liquid helium) thereto. Accordingly, superconducting magnet system 200 includes a cold plate 260 which is connected to, and cooled by, cold head 301. Beneficially, cold plate 260 may be a closed system which is filled with and may circulate a cryogenic fluid, for example liquid helium. In turn, cold plate 360 cools electrically conductive coil(s) 230 down to a temperature such as about 4° K where electrically conductive coil(s) 230 become superconductive.

Accordingly, in operation, in some example embodiments the temperature of inner region 212a may be about 4.2° K. Furthermore, the temperature of thermal shield 213 may be about 40° K. In that case, if ambient room temperature outside cryostat 210 is 300° K, for example, then the temperature drop across the space defined by inner region 212a may be in a range from about 4.2° K to about 40° K, and the temperature drop across the space defined by outer region 212b may be in a range from about 40° K to about 300° K.

Persistent current switch 240 may comprise a piece of superconductor wire connected across opposite ends of electrically conductive coil(s) 230 via seventh and eighth electrically conductive leads 207 and 208, attached to a small heater.

Magnet controller 280 may comprise a processor and memory, including nonvolatile memory and volatile memory. The nonvolatile memory may store programming code or instructions (software) for causing the processor to execute one or more algorithms for controlling operations of superconducting magnet system 280, for example a process of energizing electrically conductive coil 230. Magnet controller 280 may also be connected to, and control operations of, switches 215 and 225 and first and second electrically conductive leads 202 and 204.

In some embodiments, fifth and sixth electrically conductive leads 205 and 206 each may be low-loss leads which conduct a minimal amount of external heat to inner region 212a of cryostat 210. Beneficially fifth and sixth electrically conductive leads 205 and 206 each may be made of a material which experiences superconductivity at a relatively high temperature, for example a temperature greater than 50° K, and in particular at or around 77° K. Beneficially, third and fourth electrically conductive leads 203 and 204, and fifth and sixth electrically conductive leads 205 and 206, may be anchored thermally to thermal shield 213. In some embodiments, third and fourth electrically conductive leads 203 and 204 may be made of copper or brass.

In one variation, superconducting magnet system 200 includes first and second switches 215 and 225 disposed in cryostat 210 and configured to be controlled by magnet controller 280 to selectively connect first and second electrically conductive leads 201 and 202 to third and fourth electrically conductive leads 203 and 204, respectively, during energization of electrically conductive (superconductive) coil(s) 230.

In another variation of superconducting magnet system 200, first and second electrically conductive leads 201 and 202 may each be retractable leads which are retractable and extendable under control of magnet controller 280. Each of first and second electrically conductive leads 201 and 202 may be configured in a retracted position to be disposed entirely outside, or substantially entirely outside, of cryostat 210, and in an extended position to extend into cryostat 210 and be engaged with, and be electrically connected to third and fourth electrically conductive leads 203 and 204 (for example via contact or transfer switches 215 and 225).

During a startup operation of superconducting magnet system 200, the wire in persistent current switch 240 is heated above its transition temperature, so that it becomes resistive. Magnet controller 280 closes switch 235 and connects an external supply to first and second electrically conductive leads 201 and 202 and thereby to electrically conductive coil(s) 230 (e.g., via fifth, sixth, seventh and eighth electrically conductive leads 205, 206, 207 and 208). In some embodiments, this may mean that magnet controller 280 extends first and second electrically conductive leads 201 and 202 into cryostat 210 to be engaged with, and electrically connected to, third and fourth electrically conductive leads 203 and 204 (for example via contact or transfer switches 215 and 225). In other embodiments, this may mean that magnet controller 280 closes first and second switches 215 and 225 to connect first and second electrically conductive leads 201 and 202 to third and fourth electrically conductive leads 203 and 204.

Electrically conductive coil(s) 230 is initially energized by the external power supply passing a current through electrically conductive coil(s) 230. Since the wire in persistent current switch 240 is being heated during the startup operation, its resistance is substantially greater than that of electrically conductive coil(s) 230, so the current from the external power supply passes through electrically conductive coil(s) 230. As electrically conductive coil(s) 230 is cooled by cold plate 260, electrically conductive coil(s) 230 becomes superconducting and thus functions as a superconducting magnet.

To go to persistent mode, the current through electrically conductive coil(s) 230 is adjusted until the desired magnetic field is obtained, then the heater in persistent current switch 240 is turned off. After the heater is turned off, the superconductor wire in persistent current switch 240 cools to its superconducting temperature, short-circuiting electrically conductive coil(s) 230, which as mentioned above is also superconducting. Magnet controller 280 then disconnects first and second electrically conductive leads 201 and 202 from third and fourth electrically conductive leads 203 and 204, respectively, and thereby disconnects the external power supply from electrically conductive coil(s) 230. In some embodiments, this may mean that magnet controller 280 retracts first and second electrically conductive leads 201 and 202 from cryostat 210 to be disengaged from, and electrically disconnected from third and fourth electrically conductive leads 203 and 204. In other embodiments, this may mean that magnet controller 280 opens first and second switches 215 and 225 to disconnect first and second electrically conductive leads 201 and 202 from third and fourth electrically conductive leads 203 and 204. Thenceforth, electrically conductive (superconducting) coil(s) 230 continue to be cooled by cold head 301 via the cryogenic fluid (e.g., liquid helium) circulating in cold plate 260.

As noted above, stray molecules that may be released into the vacuum space of cryostat 210 from very small leaks. Such stray molecules can become a mechanism for heat transfer. Accordingly, a getter (not shown in FIG. 2) may be provided within cryostat 210, and in particular within inner region 212a of cryostat which is maintained at a very low temperature (e.g., below 20° K) so as to absorb those stray molecules. However, if this getter is allowed to heat up, for example due to a malfunction of compressor 270, or due to a loss of AC Mains power, or for other reasons, then the stray molecules which have been captured by the getter may be released into cryostat 210, which may heat the superconducting coil(s) 230 and lead to a quench of the magnetic field. If that occurs, a startup process may have to be repeated. Additionally, an expensive and time-consuming vacuum pump down of the cryostat may be required to remove the released molecules from cryostat 210.

Accordingly, a system and method have been developed for maintaining the vacuum in a cryostat of a superconducting magnet system, such as superconducting magnet system 200, in the event of a loss of cooling. Examples of such a system and method will now be described with respect to FIGS. 3 and 4.

Figure 3:
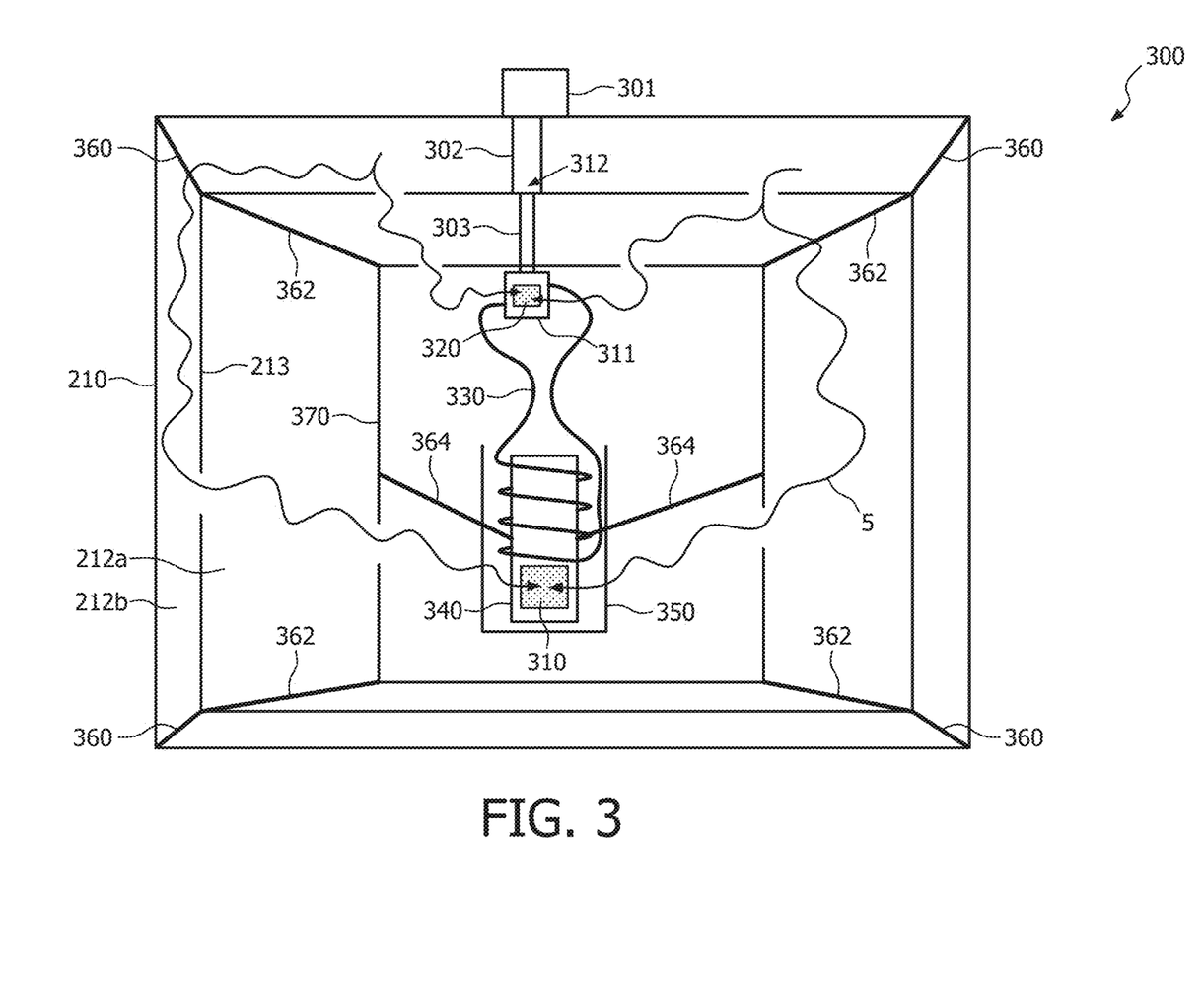
FIG. 3 illustrates an exemplary embodiment of a cooling arrangement for a getter which may be employed in superconducting magnet system which may be included in an MRI apparatus.

FIG. 3 illustrates an exemplary embodiment of a cooling arrangement 300 for a getter which may be employed in superconducting magnet system which may be included in an MRI apparatus. In particular, arrangement 300 may be included in superconducting magnet system 200, and may be included in MRI apparatus 100.

FIG. 3 shows vacuum chamber/cryostat 210, thermal shield 213, inner region 212a, outer region 212b, and cold head 301, including a first stage 302 and a second stage 303, as also shown in FIG. 2. FIG. 3 also shows: a first cold station 311 and a second cold station 312 provided by cold head 301; a first getter material 310 and a second getter material 320; a convective cooling loop 330; a thermal mass 340; a thermally reflective structure 350; a plurality of first low thermal conductivity support elements 360; a plurality of second low thermal conductivity support elements 362; a plurality of third low thermal conductivity support elements 364; and a low temperature chamber 370.

First cold station 311, first and second getter materials 310 and 320, convective cooling loop 330, thermal mass 340, thermally reflective structure 350, second low thermal conductivity support elements 362, third low thermal conductivity support elements 364, and low temperature chamber 370 are all disposed within inner region 212a. In operation, inner region 212a may be maintained at a temperature below 20° K; in some embodiments at a temperature of about 4.2° K. In that case, first cold station 311 may be referred to as a 4° K cold station. Second cold station 312 and first low thermal conductivity support elements 360 are disposed within outer region 212b. In operation, inner region 212b may be maintained at a temperature below 70° K; in some embodiments at a temperature of about 40° K. In that case, second cold station 312 may be referred to as a 40° K cold station. Furthermore, low temperature chamber 370 may be referred to as a 4° K chamber.

In some embodiments, convective cooling loop 330 comprises one or more metallic (e.g., stainless steel) tubes which are filled with a pressurized cryogenic gas, for example pressurized helium gas. Convective cooling loop 330 is connected between thermal mass 340 and first cold station 311.

Thermal mass 340 is adjacent to first getter material 310 and in thermal communication with the first getter material 310 so as to absorb heat from first getter material 310. Here, "adjacent to" is understood to mean in very close proximity to, but not necessarily requiring direct contact with. However, in some embodiments, thermal mass 340 may be in direct contact with first getter material 310. In some embodiments, thermal mass 340 may be thermally coupled to first getter material 310 via some intervening coupling element having a very low thermal impedance, such as a thermally conductive washer, thermal grease, etc. which can effectively thermally couple all or almost all thermal energy from first getter material 310 to first cold station 311. Beneficially, thermal mass 340 is capable of absorbing substantial heat energy from first getter material 310 at very low temperatures, for example temperatures below about 20° K. Beneficially, thermal mass 340 has a substantially greater heat capacity than first cold station 311. In some embodiments, thermal mass 340 is capable of absorbing at least 10 kilojoules of thermal energy for a temperature change from 4° K and 20° K. In some embodiments, thermal mass 340 is capable of absorbing at least 50 kilojoules of thermal energy for a temperature change from 4° K and 20° K. Significantly, first cold station 311 is disposed within vacuum chamber/cryostat 310 at a height which is greater than the height at which thermal mass 340 is disposed. That is, first cold station 311 is disposed within vacuum chamber/cryostat 310 above (but not necessarily directly above) thermal mass 340 with reference to earth.

Beneficially, in the illustrated embodiment, thermal mass 340 is additionally thermally isolated to some extent from the superconducting magnet (electrically conductive coil(s) 230) by thermally reflective structure 350 which is disposed in inner region 212a between thermal mass 340 and thermal shield 213 and which partially surrounds thermal mass 340. In some embodiments, thermally reflective structure 350 may be omitted.

Also, in the illustrated embodiment, thermal mass 340 is connected or attached to, but thermally isolated from, low temperature chamber 370 by the plurality of third low thermal conductivity support elements 364. Beneficially, except for the third low thermal conductivity support elements 364, thermal mass 340 is otherwise isolated from low temperature chamber 370. Furthermore, low temperature chamber 370 is connected or attached to, but thermally isolated from, heat shield 213 by the plurality of second low thermal conductivity support elements 362. Beneficially, except for the second low thermal conductivity support elements 362, low temperature chamber 370 is otherwise isolated from heat shield 213. Accordingly, low temperature chamber 370 may be an independent structure within inner region 212a which may function as a structural support frame for thermal mass 340. Finally, heat shield 213 is connected or attached to, but thermally isolated from, the one or more walls of vacuum chamber/cryostat 210 by the plurality of first low thermal conductivity support elements 360. Beneficially, except for the first low thermal conductivity support elements 350, heat shield 213 is otherwise isolated from the wall(s) of vacuum chamber/cryostat 210.

In some embodiments, first, second, and third low thermal conductivity support elements 360, 362 and 364 may each comprise a fiberglass, PVC or ceramic band having a high mechanical strength and a low thermal conductivity.

Here, when it is said that elements 360, 362 and 364 have "low" thermal conductivity, it is understood that this may be defined by the maximum thermal energy transfer that the elements may be able to provide for a given temperature differential across the elements. In particular, in some embodiments, first low thermal conductivity support elements 360 collectively may support a maximum heat transfer of no more than a few watts for a temperature differential from 40° K at thermal shield 213 to 300° K at the wall(s) of cryostat 310. In some embodiments, the maximum heat transfer under these conditions may be one watt or less. Similarly, in some embodiments, second low thermal conductivity support elements 362 collectively may support a maximum heat transfer of no more than 100 milliwatts for a temperature differential from 4° K at low temperature chamber 370 to 40° K at thermal shield 213. In some embodiments, the maximum heat transfer under these conditions may be 50 milliwatts or less. Finally, in some embodiments, third low thermal conductivity support elements 364 collectively may support a maximum heat transfer of no more than 10 milliwatts for a temperature differential from 20° K at thermal mass 340 to 80° K at low temperature chamber 370. In some embodiments, the maximum heat transfer under these conditions may be 5 milliwatts or less.

An explanation will now be provided as to how the system or arrangement 300 illustrated in FIG. 3 may maintain the vacuum in cryostat 210 for an extended period of time in the event of a loss of cooling from cold head 301.

In normal operation, cold head 301 cools first cold station 311 down to a low temperature, for example of about 4° K. Meanwhile, convective cooling loop 330 cools thermal mass 340, which in turn cools first getter material 310. That is, as thermal mass 340 is located at a lower height within cryostat 210 than first cold station 311, heat will rise through convective cooling loop from thermal mass 340 to first cold station 311. Thus, first cold station cools first getter material 310 via first cooling loop 330. When first getter material 310 reaches a sufficiently low temperature (e.g., below 20° K) then it absorbs stray molecules 5 which may be present in cryostat 210. As long as cold head 301 is operational, then it maintains first getter material 310 at or below the sufficiently low temperature via the actions of convective cooling loop 330 and thermal mass 340.

When cooling power is lost, i.e., when cold head 301 is no longer operating—for example due to a malfunction of compressor 270, a loss of AC Mains power, during transportation of an MRI apparatus (e.g., MRI apparatus 100) in which cryostat 210 is installed, etc.—then the temperature within cryostat 210 will begin to rise as the superconducting magnet (electrically conductive coil(s) 230) heats up. When this happens, then the temperature of first cold station 311 will also begin to rise.

In general, thermal mass 340 has a sufficiently large thermal capacity and a much lower thermal conductance than first cold station 311. As a result, the temperature of first cold station 311 will rise more quickly than the temperature of thermal mass 340. When this happens, and the temperature of first cold station 311 rises to a higher temperature than the temperature of thermal mass 340, then convective cooling loop 330 substantially thermally isolates thermal mass 340 from first cold station 311. A reason for this is that convective cooling loop 330 conveys heat via a convection, and thus in the direction in which the heat rises. However, since first cold station 311 is disposed within vacuum chamber/cryostat 310 at a height which is greater than the height at which thermal mass 340 is disposed, then heat from first cold station 311 cannot be transferred by convective cooling loop to thermal mass 340 in the event that the temperature of first cold station 311 is higher temperature than the temperature of thermal mass 340. It is understood that a much smaller amount of heat may be transferred from thermal mass 340 to cold station 311 via conduction of the metal tubes or pipes of convective cooling loop 330. So here, the term "substantially thermally isolates" is understood to have a specific meaning, namely that convection cooling between the two components is prevented, and any remaining thermal connection is only via conduction.

Meanwhile thermal mass 340 continues to absorb heat from first getter material 310, thereby extending a period of time where first getter material 310 remains active to capture and retain stray molecules 5 which may be present within cryostat 310. Furthermore, heat is not readily absorbed by thermal mass 340 from its environs as it essentially thermally floats with respect to the temperatures of heat shield 213 and the walls of vacuum chamber/cryostat 213 by virtue of first, second, and third low thermal conductivity support elements 360, 362 and 364. Accordingly, the vacuum within cryostat 310 may be maintained for an extended period of time to ride through a time period when the cryocooler is not operating.

In some embodiments, first and second getter materials 310 and 320 may each comprise activated charcoal. In some embodiments, second getter material 320 may be provided to capture stray molecules 5 during a time when thermal mass 340 and first getter material 310 are still being cooled down to operating temperature (e.g., below 20° K). In some embodiments, second getter material 320 may be omitted.

In some embodiments, thermal mass 340 may comprise a thermal mass of water ice. Water ice is relatively inexpensive, and furthermore has an enthalpy which is twenty times that of copper up to temperatures of 20° K, making it an advantageous material for maintain a temperature of getter 320 below a temperature at which it begins to release captured molecules in the event of loss of cooling from cold head 301.

Figure 4:
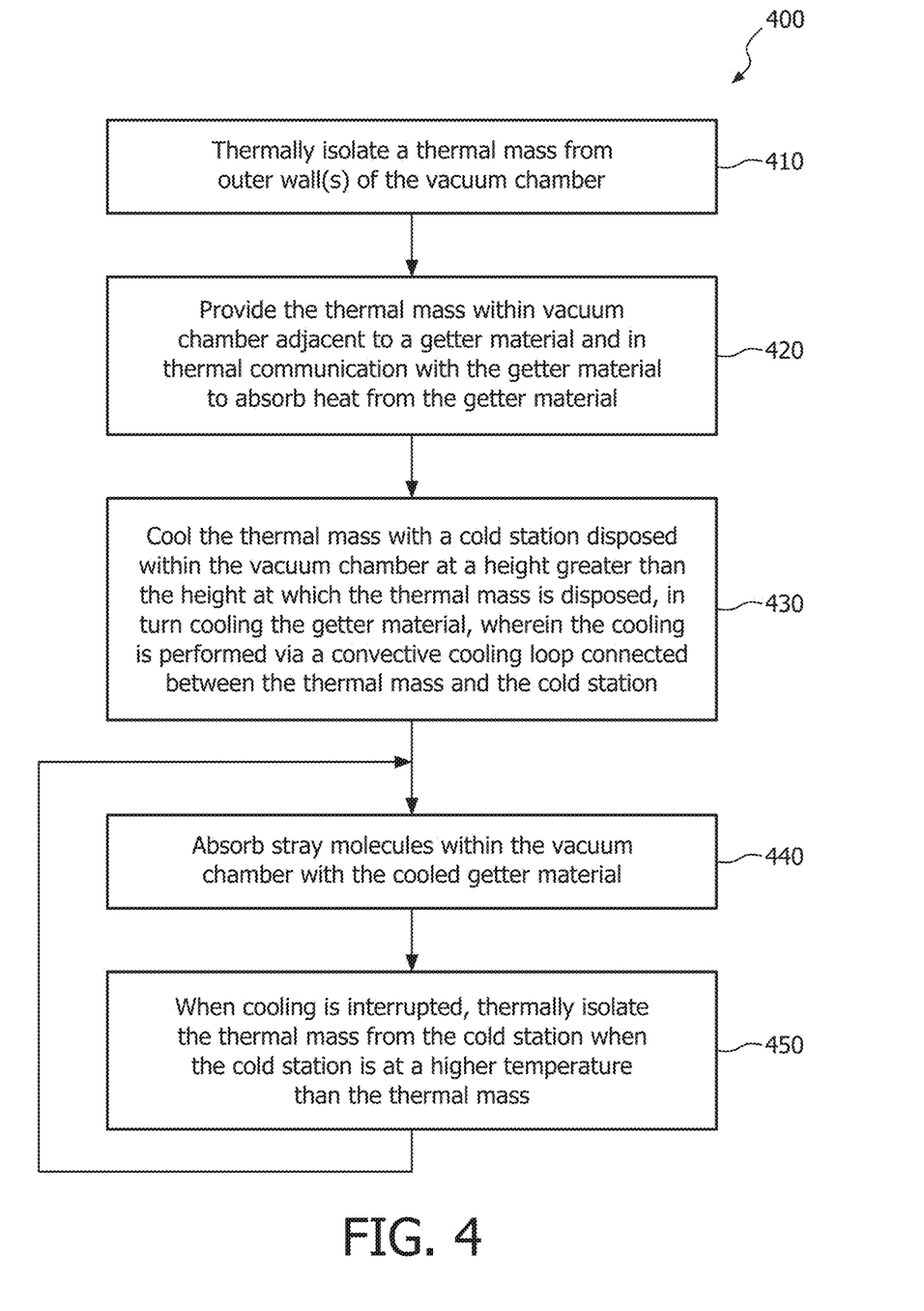
FIG. 4 illustrates some example elements of a method of maintaining a vacuum in a superconducting magnet system when cooling is interrupted.

FIG. 4 illustrates some example elements of a method 400 of maintaining a vacuum in a superconducting magnet system when cooling is interrupted.

In an element 410 of the method 400, a thermal mass is thermally isolated from the outer walls of a vacuum chamber. As explained above, in some embodiments this may be done via a plurality of low thermal conductivity support elements.

In another element 420 of the method 400, the thermal mass is disposed within the vacuum chamber adjacent to a getter material and in thermal communication with the getter material to absorb heat from the first getter material.

In another element 430 of the method 400, a cold station disposed within the vacuum chamber at a height greater than a height at which the thermal mass is disposed, cools the thermal mass, in turn cooling the getter material. Here, the cooling is performed via a convective cooling loop connected between the thermal mass and the cold station.

In another element 440 of the method 400, the cooled getter material absorbs stray molecules within the vacuum chamber.

In another element 450 of the method 400, when the cold station is at a higher temperature than the thermal mass—for example when a cryocooler cooling the cold station is not functioning—then the convective cooling loop substantially thermally isolates the thermal mass from the cold station. As a result, the getter material remains at a low temperature necessary for its proper operation for an extended period of time, even when the cooling is no longer being provided to the vacuum chamber/cryostat.

While preferred embodiments are disclosed herein, many variations are possible which remain within the concept and scope of the invention. Such variations would become clear to one of ordinary skill in the art after inspection of the specification, drawings and claims herein. The present invention therefore is not to be restricted except within the scope of the appended claims.

What is claimed is:

1. An apparatus, comprising:
    a vacuum chamber;
    a first getter material disposed within the vacuum chamber;
    a thermal mass disposed adjacent the first getter material and in thermal communication with the first getter material;
    a cold station disposed within the vacuum chamber; and
    a cooling loop coupled between the thermal mass and the cold station, the cooling loop configured to convectively cool the thermal mass when the cold station is at a lower temperature than the thermal mass, and to substantially thermally isolate the thermal mass from the cold station when the cold station is at a higher temperature than the thermal mass.

2. The apparatus of claim 1, wherein the thermal mass comprises a thermal mass of water ice.

3. The apparatus of claim 1, wherein the cold station is a 4° K cold station.

4. The apparatus of claim 3, further comprising:
    a thermal shield disposed within the vacuum chamber dividing the vacuum chamber into an inner region and an outer region; and
    a plurality of first low thermal conductivity support elements which connect the thermal shield to one or more outer walls of the vacuum chamber,
    wherein the thermal shield is isolated from the outer walls of the vacuum chamber except for the first low thermal conductivity support elements.

5. The apparatus of claim 4, further comprising:
    an independent structure disposed within an inner region of the vacuum chamber; and
    a plurality of second low thermal conductivity support elements which connect the independent structure to the thermal shield,
    wherein the independent structure is isolated from the thermal shield except for the second low thermal conductivity support elements.

6. The apparatus of claim 5, further comprising a plurality of third low thermal conductivity support elements which connect the thermal mass to the independent structure,
    wherein the thermal mass is isolated from the independent structure except for the third low thermal conductivity support elements.

7. The apparatus of claim 4, further comprising a thermally reflective structure disposed within the first region between the thermal mass and the thermal shield.

8. The apparatus of claim 1, wherein the first getter material comprises an activated charcoal material.

9. The apparatus of claim 1, further comprising a second getter material separated and apart from the first getter material and disposed adjacent to, and in thermal communication with, the cold station.

10. The apparatus of claim 1, further comprising a compressor disposed outside the vacuum chamber and connected to the cold station and configured to conduct heat from the cold station to an exterior of the vacuum chamber.

11. The apparatus of claim 1, wherein the cold station is disposed within the vacuum chamber at a height greater than a height at which the thermal mass is disposed.

12. An apparatus, comprising:
    a vacuum chamber having one or more walls enclosing an interior space of the vacuum chamber;
    a heat shield disposed within the vacuum chamber, the heat shield defining an inner region of the vacuum chamber within the heat shield and an outer region of the vacuum chamber disposed between the heat shield and the one or more walls of the vacuum chamber;
    a superconducting magnet disposed within the inner region of the vacuum chamber; a cryocooler configured to cool the superconducting magnet, the cryocooler providing at least one cold station within the inner region of the vacuum chamber;
    a getter material disposed within the inner region of the vacuum chamber;
    a thermal mass disposed adjacent the getter material and in thermal communication with the getter material; and
    a cooling loop coupled between the thermal mass and the cold station and configured to convectively cool the thermal mass when the cold station is at a lower temperature than the thermal mass, and to substantially thermally isolate the thermal mass from the cold station is at a higher temperature than the thermal mass.

13. The apparatus of claim 12, wherein the apparatus is a magnetic resonance imaging (MRI) apparatus further comprising:
    a patient table configured to hold a patient;
    gradient coils configured to at least partially surround a portion of a patient for which the MRI apparatus generates an image;
    radio frequency coil configured to apply a radio frequency signal to the portion of a patient and to alter the alignment of this magnetic field; a wherein the MRI apparatus is configured to detect changes in the magnetic field caused by the radio frequency signal.

14. The apparatus of claim 12, further comprising:
    a compressor connected to remove heat from the cryocooler; and
    a magnet controller configured to control energization operations for the superconducting magnet.

15. The apparatus of claim 12, wherein the thermal mass comprises a thermal mass of water ice.

16. The apparatus of claim 12, further comprising a plurality of first low thermal conductivity support elements which connect the thermal shield to one or more outer walls of the vacuum chamber, wherein the thermal shield is isolated from the outer walls of the vacuum chamber except for the first low thermal conductivity support elements.

17. The apparatus of claim 16, further comprising:
    an independent structure disposed within an inner region of the vacuum chamber; and
    a plurality of second low thermal conductivity support elements which connect the independent structure to the thermal shield,
    wherein the independent structure is isolated from the thermal shield except for the second low thermal conductivity support elements.

18. The apparatus of claim 17, further comprising a plurality of third low thermal conductivity support elements which connect the thermal mass to the independent structure,
  wherein the thermal mass is isolated from the independent structure except for the third low thermal conductivity support elements.

19. The apparatus of claim 12, wherein the thermal mass is disposed at a lower greater than a height at which the at least one cold station is disposed.

20. An apparatus, comprising:
a vacuum chamber;
a thermal mass disposed adjacent a getter material and in thermal communication with the getter material;
a cold station disposed within the vacuum chamber; and
a cooling loop coupled between the thermal mass and the cold station, the cooling loop configured to convectively cool the thermal mass when the cold station is at a lower temperature than the thermal mass, and to substantially thermally isolate the thermal mass from the cold station when the cold station is at a higher temperature than the thermal mass.

\* \* \* \* \*